(12) United States Patent
Pullen et al.

(10) Patent No.: US 6,836,148 B2
(45) Date of Patent: Dec. 28, 2004

(54) VERSATILE HIGH VOLTAGE OUTPUTS USING LOW VOLTAGE TRANSISTORS

(75) Inventors: Donald T. Pullen, Anaheim, CA (US); Norman L. Culp, Plano, TX (US); Xiaoyu Xi, Plano, TX (US); Keith E. Kunz, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 152 days.

(21) Appl. No.: 10/141,297

(22) Filed: May 8, 2002

(65) Prior Publication Data

US 2003/0189443 A1 Oct. 9, 2003

Related U.S. Application Data

(60) Provisional application No. 60/370,810, filed on Apr. 8, 2002.

(51) Int. Cl.[7] .......................................... H03K 19/0185
(52) U.S. Cl. ............................. 326/81; 326/83; 326/68; 327/333; 327/427; 327/434
(58) Field of Search ............................... 326/32–34, 62, 326/68, 80, 81, 83; 327/333, 427, 434

(56) References Cited

U.S. PATENT DOCUMENTS 5,995,010 A * 11/1999 Blake et al. ................ 340/653
6,351,173 B1 * 2/2002 Ovens et al. ............... 327/333
6,501,306 B1 * 12/2002 Kim et al. .................. 327/112

OTHER PUBLICATIONS

Sanchez et al., "*A Versatile 3.3/2.5/1.8 CMOS I/O Driver,*" IEEE Journal of Solid–State Circuits, Nov. 1999, pp. 1501–1511, vol. 34, No. 11.

Clark, Lawrence T., "*A High Voltage Output Buffer Fabricated On A 2V CMOS Technology,*" 1999 Symposium on VLSI Circuits Digest of Technical Papers, 1999, pp. 61–62.

Ballan, et al., "*High Voltage Device and Circuits in Standard CMOS Technologies,*" Kluwer Academic Publishers, 1999, p. 192.

* cited by examiner

Primary Examiner—Vibol Tan
(74) Attorney, Agent, or Firm—Ronald O. Neerings; Wade James Brady, III; Frederick J. Telecky, Jr.

(57) ABSTRACT

A output driver architecture (100) is proposed that uses thin gate-oxide core and thin gate-oxide Drain-extended transistors that can directly interface with voltage supplies up to six times the normal rating of the transistor. A bias generator (101), level shifter (103) and output stage (105) are adapted to buffer an input signal with a voltage swing of less than the normal operating voltage of the transistors to an output signal with a voltage swing of up to approximately six times the normal operating voltage of the transistors. The bias generator is interfaced directly with a high voltage power supply and generates a bias voltage with a magnitude of less than the dielectric breakdown of the transistors internal to the level shifter and output stage. Further, the bias generator is adapted to sense the magnitude of the high voltage supply, and to automatically and continuously self-adjust the bias voltage in response to changes sensed in the magnitude of the high voltage supply such that the bias generator can be used for a continuous range of high voltage supplies up to 6 times the normal operating voltage of the transistors.

28 Claims, 6 Drawing Sheets

VERSATILE HIGH VOLTAGE OUTPUTS USING LOW VOLTAGE TRANSISTORS

This application claims the priority under 35 U.S.C. 119(e)(1) of copending U.S. provisional application No. 60/370,810, filed on Apr. 8, 2002 and incorporated herein by reference.

BACKGROUND OF THE INVENTION

1. Technical Field of the Invention

The present invention generally relates to the field of semiconductor devices and, more particularly, to high voltage outputs drivers.

2. Description of Related Art

With the dramatic scaling of transistor dimensions, advanced CMOS technologies have seen dramatic scaling of operating voltage while their interface voltages to the outside world are changing much slower due to backward compatibility or system related constraints. That is, the breakdown voltages of leading edge transistors, such as thin gate-oxide transistors, is being reduced while many peripherals continue to utilize higher I/O supply voltages (OVDD). When interfacing between a high level OVDD peripheral and an integrated circuit, the design must protect against the integrated circuit receiving a voltage signal which is higher than the supply voltage (VDD) intended for the transistors.

Another disturbing trend is that as the number of transistors on a chip increases with each new technology, so does their leakage as well. This makes power management more necessary, but at the same time, it makes integrated analog power management design more challenging. Many current and anticipated power management solutions require direct interface to a battery.

There have been attempts to utilize thin gate-oxide transistors to interface with higher voltages, but the limitations of previously proposed solutions demand a more general and versatile solution.

SUMMARY OF THE INVENTION

The present invention achieves technical advantages as a method and apparatus using thin gate-oxide core and drain-extended transistors to interface with voltages up to six times the normal rating of the transistors. The present apparatus and system can be applied to a variety of high voltage circuit solutions, while still being capable of reliable startup. Further, a large number of power management solutions that require direct interface to a battery, for example, can exploit the benefits of the present method and apparatus for improving power efficiency and integratability into future CMOS processes.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others.

Throughout the drawings, it is noted that the same reference numerals or letters will be used to designate like or equivalent elements having the same function. Detailed descriptions of known functions and constructions unnecessarily obscuring the subject matter of the present invention have been omitted for clarity.

Figure 1:
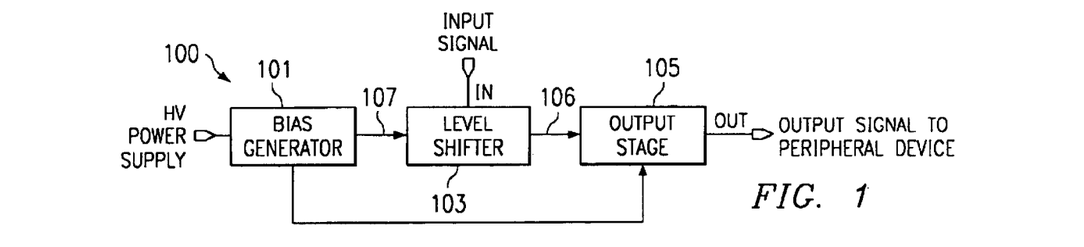
FIG. 1 illustrates a simple block diagram of an output driver in accordance with an exemplary embodiment of the present invention.

Referring now to FIG. 1 there is shown a simple block diagram of an output driver 100 using thin gate-oxide core and thin gate-oxide drain-extended (DE) transistors. The output driver 100 is adapted to buffer an input signal with a voltage swing of less than the normal operating voltage of the transistors to an output signal with a voltage swing of up to approximately six times the normal operating voltage of the transistors. The output driver 100 includes a bias generator 101, a level shifter 103 and an output stage 105.

Figure 2:
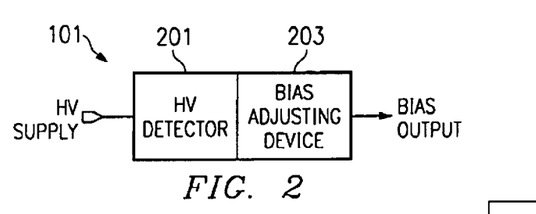
FIG. 2 illustrates an exemplary embodiment of the bias generator shown in FIG. 1.

The bias generator 101 is referenced directly with a high voltage power supply (which can be as much as 6 times the normal operating voltage of a transistor) and generates a bias voltage used for limiting the gate-to-source/drain voltages of transistors internal to the level shifter 103 and output stage 105 to avoid exceeding their dielectric breakdown. Further, as shown in exemplary FIG. 2, the bias generator 101 includes a sensing device 201 adapted to sense the magnitude of the high voltage supply. Cooperable with the sensing device 201 is an adjusting device 203 which is adapted to automatically and continuously self-adjust the bias voltage in response to changes sensed in the magnitude of the high voltage supply such that the bias generator can be used for a continuous range of high voltage supplies up to 6 times the normal operating voltage of the transistors. This enables a maximum voltage tolerable across the transistors used in the output driver 100.

Figure 9A:
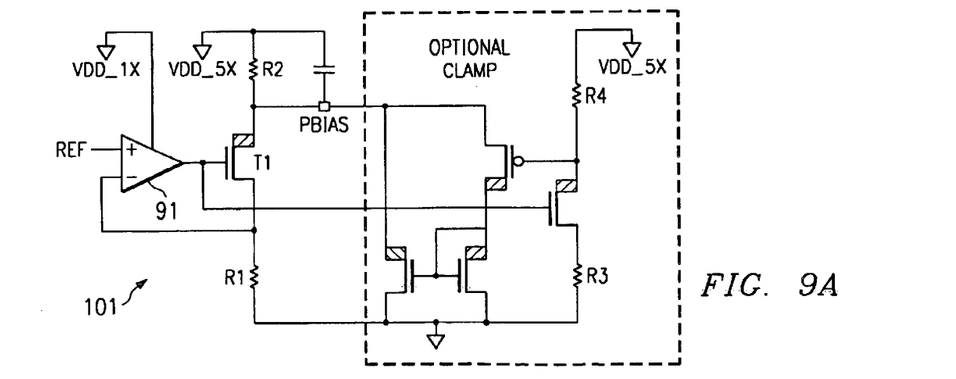
FIGS. 9A–9C illustrate conceptual views of high-voltage interfaced bias circuits in accordance with an exemplary embodiments of the present invention.

More particularly, FIG. 9A illustrates an exemplary analog controlled high-voltage interfaced bias circuit for use as the bias generator 101. Referring to FIG. 9A, op amp 91, resistor R1 and the DE transistor T1 act as a voltage-to-current converter such that the current is adjusted to set the voltage across R1 equal to approximately "REF", which enables a fixed current across R2 proportional to the voltage signal from the high voltage power supply (VDD__5×). The corresponding voltage drop across R2 sets the voltage PBIAS. Thus, PBIAS is referenced directly to the high voltage power supply.

REF can be, for example, a Bandgap voltage which is independent of voltage, process and temperature. The ratio of resistors R1 and R2 is important while their absolute values are not, which allows for a solution independent of process variation as long as matching is maintained. The ratio of resistors R1 and R2 is determined by the REF voltage and the voltage drop referenced from the high voltage supply (VDD__5×). For example, if the gate oxide limitations for the transistors used in the bias generator 101 require that PBIAS be greater than VDD__5×–1.5V, where REF=0.5V, the ratio of R2 and R1 will be 3-to-1. In another configuration with even thinner gate oxide transistors, PBIAS can be limited to greater than VDD__5×–1.0V, with REF=0.5V, in which case the ratio of R2 and R1 will be 2-to-1. REF can come, for example, from an internal/external bandgap or from a crude diode voltage reference.

It can be seen that this bias circuit senses the high voltage supply and, responsive thereto, self-adjusts PBIAS. This capability allows automatic detection and adaptation to its own power supply without the need for programming as the voltage supply magnitude changes for different applications.

Figure 7:
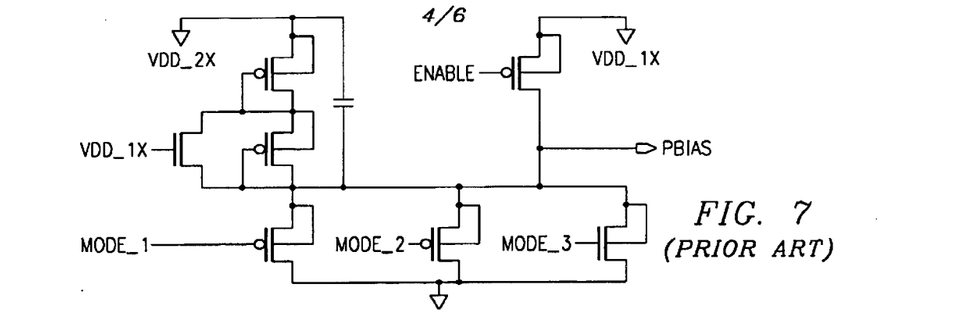
FIG. 7 illustrates a conceptual view of bias control circuit.

The use of the drain-extended MOS as the active voltage clamp advantageously enables direct referencing to a high voltage power supply rather than using the typical crude digitally controlled voltage divider technique, such as that shown in FIG. 7 and described in, Sanchez et al., "A Versatile 3.3/2.5/1.8 CMOS I/O Driver", in IEEE JSSC, Nov. 1999, pages 1501–1511.

For approaches such as that illustrated in FIG. 7, the user must know the high voltage magnitude in order to externally program the resistor divider network for each respective application. The resistor divider network generally includes the MOS connected diodes from VDD__2× to PBIAS and the Mode control switches to ground. Pins MODE__1, MODE__2 and MODE__3 control the resistive switches. The switches being on or off modifies the resistive path between the high voltage supply and ground. Therefore, the PBIAS is controllable with respect to ground. This lowers or raises the PBIAS voltage dependent on what the user desires. As shown, the user must know VDD__2× in order to set the right Mode control. Here, at least the DC value is referenced to the Mode control and not to VDD__2×. In addition, this approach is limited to two times the normal operating voltage, and VDD__1× must be present for proper operation, since the ENABLE switch sets the PBIAS to VDD__1×.

In accordance with the present invention, PBIAS is referenced directly to the high voltage supply and the drain-to-bulk/well breakdown of the DEMOS devices enables the fundamental limitation of max-tolerated voltage from approximately 4× to 6× the normal rating of the transistor without need for a programmed resistive network.

Further, loss of the reference voltage (REF) or the low voltage supply (VDD__1×) places the driver 100 in a high impedance state with 0 dc power dissipation (neglecting leakage). That is, the driver 100 is disabled. Additionally, the parallel coupled capacitor enables load current operation for essentially making PBIAS a low impedance node. Thus, PBIAS is adapted to be shared by multiple switching circuits (as used in the level shifter 103 and output stage 105 further discussed hereinafter).

FIG. 9A also shows an optional clamp circuit which can be used in cooperation with the above-described bias circuit. This clamp circuit is replica bias circuitry which assists in start-up conditions, and also assists where possible unknown leakage paths may tend to pull PBIAS high. Again, the ratio of resistors R3 and R4 is important while their absolute values are not, which allows for a solution independent of process variation as long as matching is maintained. The optional clamp circuit can also be used with the exemplary bias circuits of FIGS. 9B and 9C.

Figures 9B, 9C:
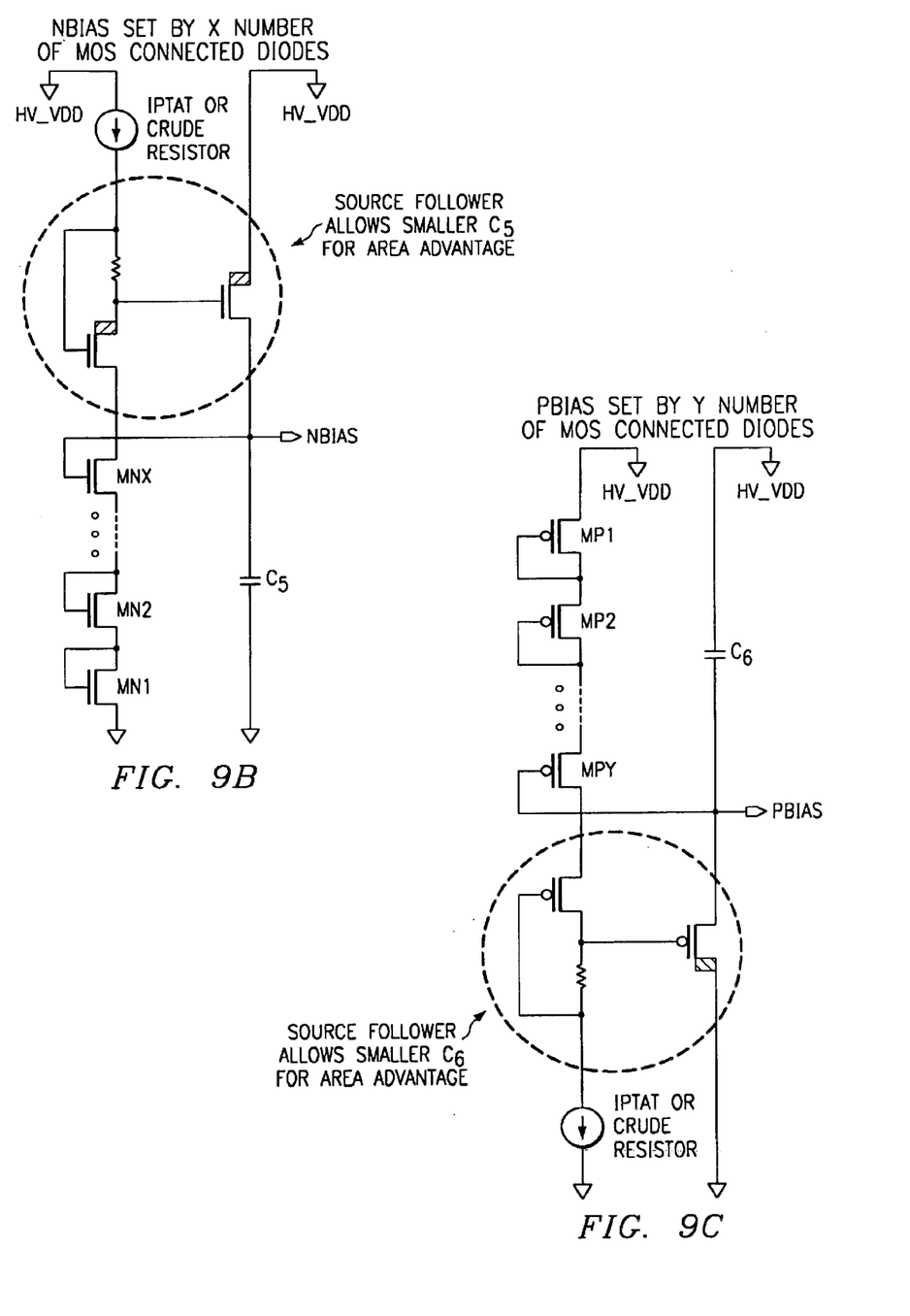

FIGS. 9B and 9C illustrate exemplary digital controlled high-voltage interfaced bias circuits which can be used as the bias generator 101. Though, the circuit of FIG. 9A will generally give a more exact voltage given that the REF is ideal, the circuits of FIGS. 9B and 9C require no reference and are therefore less costly in area and power. The embodiments of FIGS. 9B and 9C use the generally constant property of the transistor's Vt. MOS connected diodes are used which have a voltage drop close to the Vt of the transistor.

More specifically, in FIG. 9C, a PBIAS is set through a cascade of y number of PMOS connected diodes (MP1, MP2 and MPY) and a parallel coupled capacitor C6. The coupled source follower (combination of a resistor and thin gate-oxide and drain-extended gate-oxide transistors) is adapted to enable the size of the capacitor C6 to be reduced for appropriate applications. This can be particularly important for many microprocessor designs since production limits on chip capacitance often require that a large circuit capacitor be taken external. Further, since the MOS connect diode has a lower impedance than the drawn resistor, PBIAS is also referenced to the high voltage power supply (HV__VDD). The IPTAT can be a MOS used in a current source configuration.

In FIG. 9B, a NBIAS is set through a cascade of x number of NMOS connected diodes (MN1, MN2 and MNX) and a parallel coupled capacitor C5. Here, the bias is referenced with respect to ground. Again, the coupled source follower (combination of a resistor and thin gate-oxide and drain-extended gate-oxide transistors) is adapted to enable reduction in the size of the capacitor C5.

Referring back to FIG. 1, the level shifter 103 acts as an inverter that translates a VDD-to-Ground signal input at the "IN" node to an OVDD-to-PBIAS signal 106 where PBIAS is received at 107 from the bias generator 101 and OVDD can be as much as 6 times the normal operating voltage of a transistor. The output stage 105 translates the OVDD-to-PBIAS signal 106 to an OVDD-to-Ground signal output at the "OUT" node. The level shifter 103 and output stage 105 are both interfaced directly to the high voltage power supply.

Figure 6:
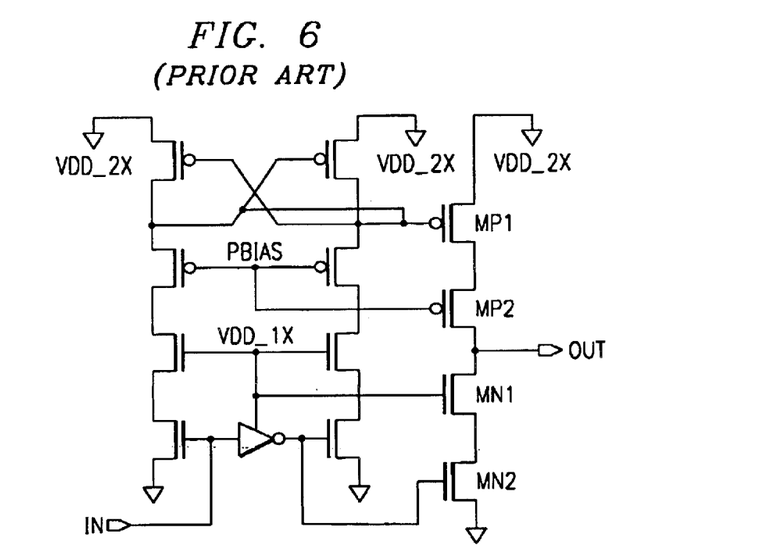
FIG. 6 illustrates a level-shifter and output stage which enables 2x the rated transistor voltage and optimum active power dissipation.

A prior approach for level shifting which includes an output stage is shown in FIG. 6. Here, clamping critical drain to source voltages is accomplished using cascoded transistor devices and low impedance clamps to limit Vgs to ensure reliable operation of the output driver, however, this approach has a maximum interface of only 2 times the normal rating of the transistors. In addition, this approach suffers from reliability concerns during start-up due to power-up sequencing requirements. If the LV power supply (shown as VDD_1x) doesn't come up before the high voltage power (shown as VDD_2x), there will be a damaging gate-drain stress on the output transistor MN1 and others biased like it. Additionally, there will be a gate-source stress on output transistors MP1 and MP2. This is typically a major design problem since the high voltage power supply often comes-up before the low voltage supply.

Figure 8:
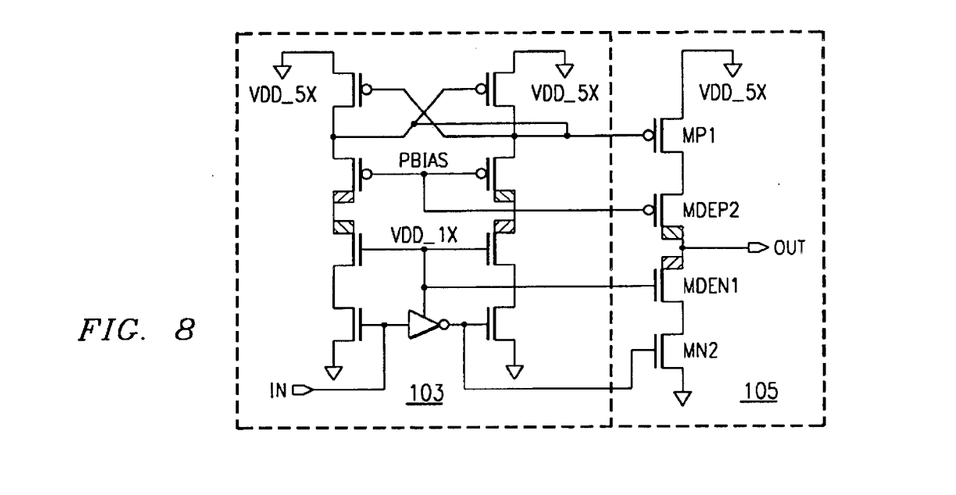
FIG. 8 illustrates an optimized level-shifter and output stage that allows 4–6x the rated transistor voltage and optimized for power dissipation in the active and disabled modes.

Referring now to FIG. 8 there is shown a circuit diagram of the level shifter 103 and output stage 105 in accordance with an exemplary embodiment of the present invention. As can be seen, the present approach is similar to that shown in FIG. 6 except that the level shifter 103 and output stage 105 are advantageously comprised of standard thin-gate transistors cascoded with drain-extended transistors interfaced directly with the high voltage power supply which can be as much as 6 times the normal operating voltage of the transistors. In addition to enabling direct interfacing with 6x voltages, the level shifter 103 and output stage 105 are protected from the above-described start-up concerns by virtue of the cooperative control circuitry of the bias generator 101. As mentioned, with loss of VDD_1x or REF, PBIAS decays to the high volt power supply VDD_5x. Thus, all the voltage stress drops across the gate-drain junction of both output stage 105 transistors DEPMOS (MDEP2) and the DENMOS (MDEN1). All this at no cost of DC current because the drain-extended transistors by design handle their maximum voltage from gate to drain, therefore, no power-sequencing is required.

In addition to power-sequencing design cost savings, the present solution also enables improved power consumption over typical driver designs. The following discussion illustrates how the combination of Drain-Extended MOS transistors "DEMOS" and standard thin-gate-oxide transistor enables improved power consumption for high voltage circuits in advanced CMOS processes. Power consumption is a major concern for low-power solutions. Power consumption is normally measured in 2 modes. In a "disabled" mode, the device is off and some finite DC current is normally present. In the "active" mode, the power dissipation can be broken up into AC (switching loss) and DC (from DC current flow) components.

Figure 3A:
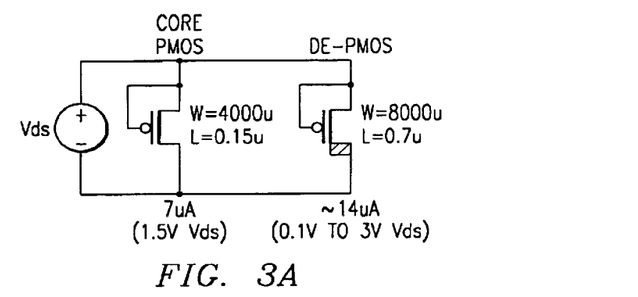
FIG. 3A illustrates a schematic comparison of a standard 1.5V core transistor and a thin gate-oxide DE-PMOS.
Figure 3B:
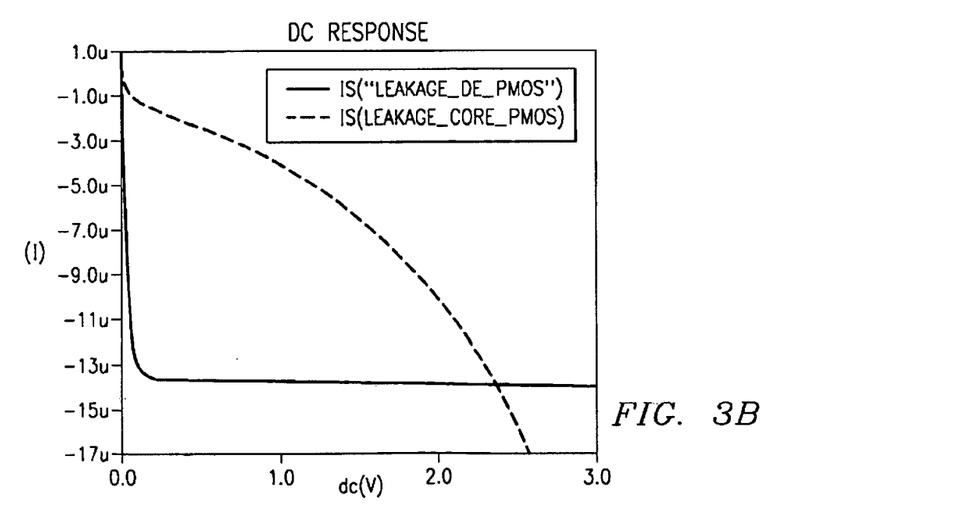
FIG. 3B illustrates a waveform comparing leakage currents of a core transistor and a DE-PMOS vs. Vds at a temperature of 125 C at a strong process corner.

In the disable mode, the major source of dc current is normally leakage current in the devices. In large-high current output drivers, this leakage can be consequential to power dissipation in the "off" mode. FIGS. 3A and 3B show a comparison of 2 different cases. It is shown that a large DEMOS can leak substantially at its nominal Vds (Drain to Source voltage) at high temperature and strong process corner. It is also worth noting that a standard core device leaks much less for the same I-drive at its nominal allowable Vds. FIG. 3B shows that for the same Idrive of the DEMOS, the standard core transistor leaks approximately ½ as much.

To understand this phenomenon one should look at the characteristic leakage vs. Vds for the DEMOS and the core device shown in FIG. 3A. While the leakage appears constant for the DEMOS with respect to Vds, the standard core transistor has a somewhat linear relationship. The flat behavior of the DEMOS is due to the fact that the leakage comes in combination from a lightly-doped reverse biased junction of the drain and due to "diffusion current", a consequence of a lower Vt and a lack of pocket implants on the drain side. The softer junction of the drain allows more voltage independence, however it is extremely temperature dependent as are most reversed biased pn junctions. The core transistor on the other hand is strongly influenced by Vds. This can be attributed to its sharper junction and higher field at the gate and drain. Its relatively much smaller channel length makes its leakage from drain to source heavily dependent on "short channel" effects. If the low leakage of the core transistor at low Vds is combined with the very constant leakage (independent of Vds) of the DEMOS device, an optimum solution is achieved.

Figure 4A:
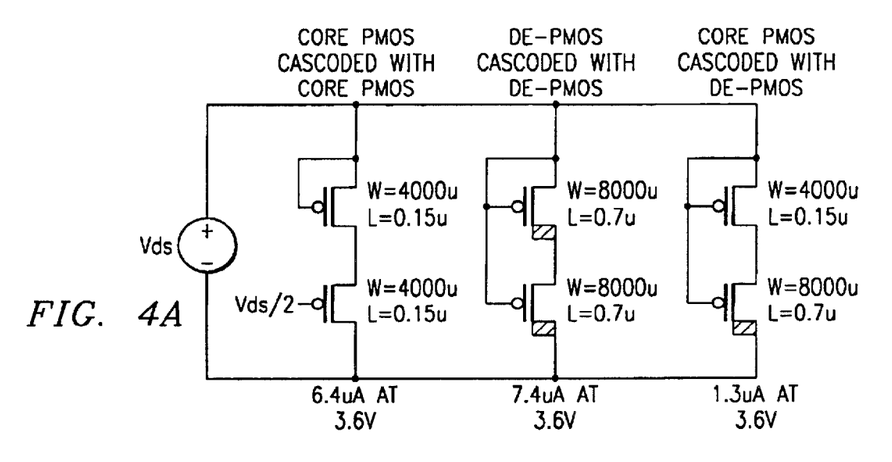
FIG. 4A illustrates different cascoded variations with equivalent I-drive.
Figure 4B:
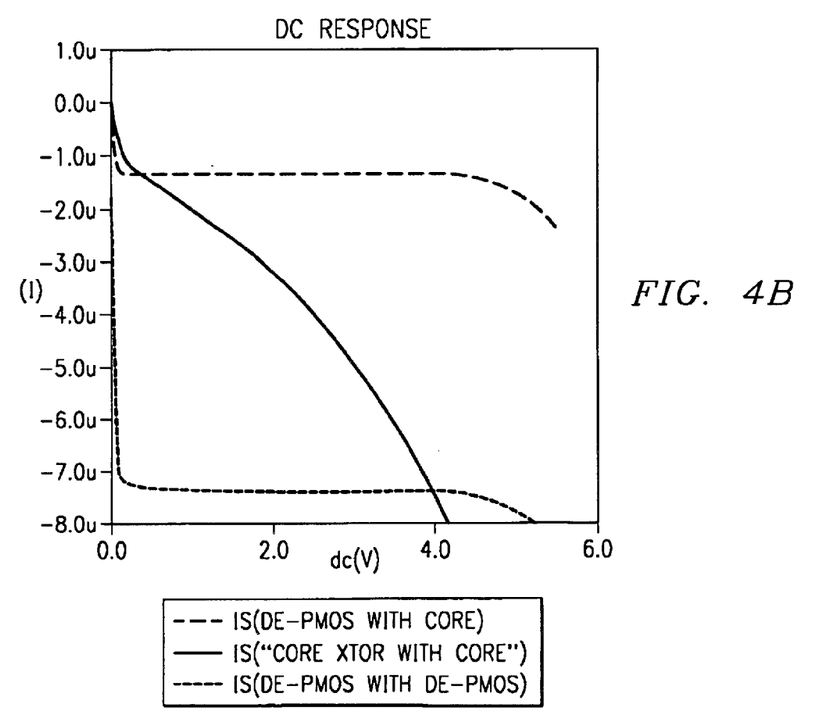
FIG. 4B illustrates a comparison of leakage of the cascoded variations shown in FIG. 4A.

For comparison, two series connected DE-PMOS devices, two standard core transistors, and a combination core transistor and a DE-PMOS device cascoded all with equivalent I-drive are compared for leakage (see FIGS. 4A and 4B). One can see there is a dramatic difference between the 3 different cascoded versions. The combination of the core with small Vds and the flat leakage with regard to Vds of the DE-PMOS make an advantageous combination. This combination is advantageously used in some embodiments of the present invention to optimize leakage.

Figure 5:
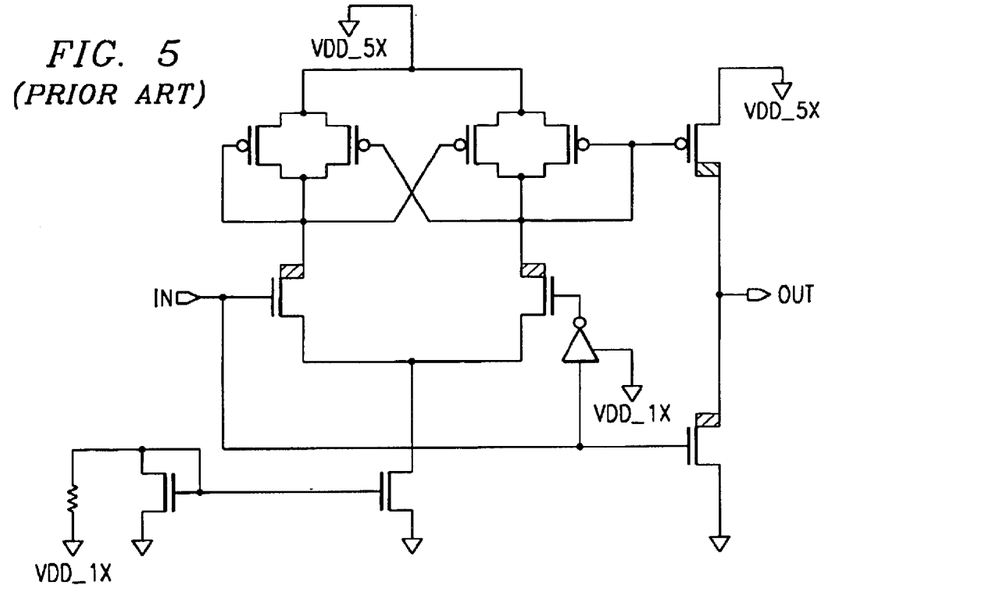
FIG. 5 illustrates a conceptual view of a high-voltage circuit.

Further, when an output driver device is active, a large portion of the power dissipation comes from "switching" components. Part of this dissipation can be modeled as:

$$P_{GATE\_DRIVE\_LOSS} = C_{GATE} * V_{SWING}^2 \cdot F$$

where Cgate is the gate capacitance, Vswing is the amplitude of the voltage swing on the gate and F is the switching frequency. Typical thick gate-oxide solutions tend to have problematic higher Vswing for a given Idrive performance and prior attempts to lower the Vswing have produced other problems. A prior solution which attempted to utilize individual DEMOS devices to minimize the Vswing is shown in FIG. 5. Here however, the Cgate is large for a given Idrive. In this configuration, a larger Cgate is unavoidable since the gate length of the DEMOS device will always be larger than the standard core transistor because of the larger gate length required. Further, this approach does not lend itself to bias control sharing so that multiple switching circuits can use the same bias node. Although this architecture allows some high voltage drive capability, it is noted that large AC switching losses, large Dc bias current loss, and higher leakage leave this approach largely unusable for many applications.

The reduced DC power dissipation to establish PBIAS for clamping, as shown in the bias generator of FIG. 9A for example, is greatly improved over the techniques used in the circuit of FIG. 5. This is largely because the PBIAS can be shared (i.e. multiple HV blocks can use the same PBIAS). Additionally, current used in the bias control of FIG. 9A is not directly tied to the speed performance as it is in the approach of FIG. 5.

Figure 10A:
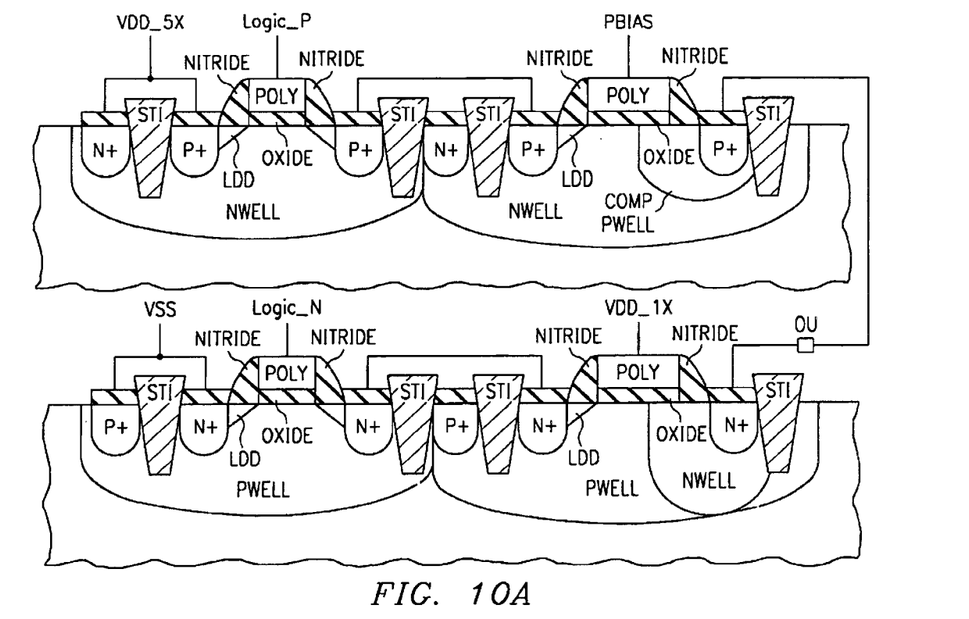
FIG. 10A illustrates a cross-sectional view of an output transistor in accordance with an exemplary embodiment of the present invention.
Figure 10B:
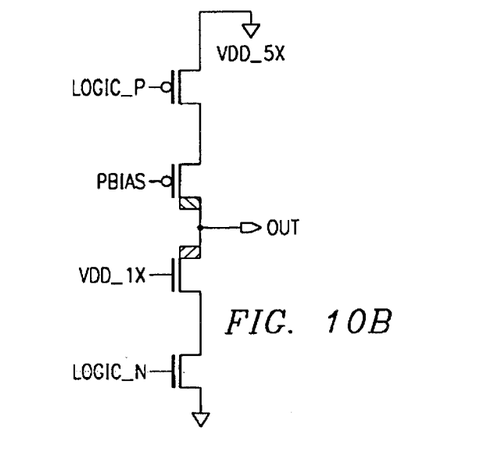
FIG. 10B illustrates a circuit diagram of the output transistor shown in FIG. 10A.

The advantageous use of cascoded standard thin-gate transistor and thin-gate DEMOS also offers increased protection against premature Bvii (Breakdown voltage Impact Ionization Induced) or CHC (Channel Hot Carrier) degradation not only due to sharing of the voltage across both transistors, but more importantly the DEMOS device's ability to reduce the electric field at the drain junction with its lightly doped drain. FIG. 10A shows a two dimensional cross section of cascoded standard thin-gate transistors and thin-gate DEMOS in accordance with an exemplary embodiment of the present invention. FIG. 10B shows a circuit diagram for the cascoded device of FIG. 10A as used in the output stage 105. The output driver 100 can be implemented in an advanced 0.15 um CMOS technology with a single 30A gate-oxide. It can act as a building block for a 100 mA switching regulator with a 5.1V input voltage and 1.5V output voltage.

Although a preferred embodiment of the method and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. An output buffer apparatus, comprising:

an input for receiving input signaling having an input voltage swing between a reference voltage and an input voltage;

an output for providing output signaling having an output voltage swing between said reference voltage and an output voltage that is greater than said input voltage;

a level shifter coupled to said input for receiving said input voltage signaling, said level shifter including an input for receiving an intermediate voltage having a predetermined relationship relative to said output voltage, said level shifter responsive to said intermediate voltage for translating said input signaling into intermediate signaling having an intermediate voltage swing between said intermediate voltage and said output voltage;

an intermediate voltage generator having an input for receiving said output voltage, said intermediate voltage generator coupled to said level shifter and responsive to said output voltage for providing said intermediate voltage to said level shifter, said intermediate voltage generator responsive to a change in said output voltage for automatically adjusting said intermediate voltage to maintain said predetermined relationship thereof relative to said output voltage; and an output stage coupled between said level shifter and said output for translating said intermediate signaling into said output signaling.

2. The apparatus of claim 1, wherein said predetermined relationship is that said intermediate voltage is less than said output voltage by a predetermined amount.

3. The apparatus of claim 1, wherein said intermediate voltage generator includes a drain extended transistor coupled between said output voltage and said reference voltage.

4. The apparatus of claim 3, wherein said intermediate voltage generator includes a compare circuit having a first input coupled to a source of said drain extended transistor and a second input for receiving a further reference voltage, said compare circuit having an output coupled to a gate of said drain extended transistor.

5. The apparatus of claim 4, wherein said intermediate voltage generator includes a first resistor connected between said reference voltage and a source of said drain extended transistor, and a second resistor connected between said output voltage and the drain of said drain extended transistor, and wherein the drain of said drain extended transistor provides said intermediate voltage.

6. The apparatus of claim 5, wherein said compare circuit includes an operational amplifier.

7. The apparatus of claim 4, wherein said compare circuit includes an operational amplifier.

8. The apparatus of claim 3, wherein said intermediate voltage generator includes a first resistor connected between said reference voltage and a source of said drain extended transistor, and a second resistor connected between said output voltage and the drain of said drain extended transistor, and wherein the drain of said drain extended transistor provides said intermediate voltage.

9. The apparatus of claim 3, wherein said drain extended transistor is an NMOS transistor.

10. An output buffer apparatus, comprising:

an input for receiving input signaling having an input voltage swing between a reference voltage and an input voltage;

an output for providing output signaling having an output voltage swing between said reference voltage and an output voltage that is greater than said input voltage;

a level shifter coupled to said input for receiving said input voltage signaling, said level shifter including an input for receiving an intermediate voltage having a predetermined relationship relative to said output voltage, said level shifter responsive to said intermediate voltage for translating said input signaling into intermediate signaling having an intermediate voltage swing between said intermediate voltage and said output voltage, said level shifter including a plurality of transistors connected in series between said reference voltage and said output voltage, wherein one of said plurality of transistors is a drain extended transistor;

an intermediate voltage generator having an input for receiving said output voltage, said intermediate voltage generator coupled to said level shifter and responsive to said output voltage for providing said intermediate voltage to said level shifter; and an output stage coupled between said level shifter and said output for translating said intermediate signaling into said output signaling.

11. The apparatus of claim 10, wherein said level shifter includes a further plurality of transistors connected in series between said reference voltage and said output voltage, and connected in parallel with said first-mentioned plurality of transistors, and wherein one of said further plurality of transistors is a drain extended transistor.

12. The apparatus of claim 11, wherein said drain extended transistor of said first-mentioned plurality is cascoded with a transistor of said further plurality other than said drain extended transistor of said further plurality, and wherein said drain extended transistor of said further plurality is cascoded with a transistor of said first-mentioned plurality other than said drain extend transistor of said first-mentioned plurality.

13. The apparatus of claim 12, wherein said transistor of said first-mentioned plurality that is cascoded with said drain extended transistor of said further plurality is connected to said output voltage, and wherein said transistor of said further plurality that is cascoded with said drain extended transistor of said first-mentioned plurality is connected to said output voltage.

14. The apparatus of claim 12, wherein said drain extended transistors are PMOS transistors, and wherein each of said pluralities of transistors includes a drain extended NMOS transistor that is drain-connected to said drain extended PMOS transistor of said plurality.

15. An output buffer apparatus, comprising:

an input for receiving input signaling having an input voltage swing between a reference voltage and an input voltage;

an output for providing output signaling having an output voltage swing between said reference voltage and an output voltage that is greater than said input voltage;

a level shifter coupled to said input for receiving said input voltage signaling, said level shifter including an input for receiving an intermediate voltage having a predetermined relationship relative to said output voltage, said level shifter responsive to said intermediate voltage for translating said input signaling into intermediate signaling having an intermediate voltage swing between said intermediate voltage and said output voltage;

an intermediate voltage generator having an input for receiving said output voltage, said intermediate voltage generator coupled to said level shifter and responsive to said output voltage for providing said intermediate voltage to said level shifter; and an output stage coupled between said level shifter and said output for translating said intermediate signaling into said output signaling, said output stage including first and second transistors connected in series between said output and one of said reference voltage and said output voltage, wherein one of said transistors is a drain extended transistor.

16. The apparatus of claim 15, wherein said output stage includes third and fourth transistors connected in series between said output and the other of said reference voltage and said output voltage, and wherein one of said third and fourth transistors is a drain extended transistor.

17. The apparatus of claim 16, wherein one of said drain extended transistors is an NMOS transistor and the other of said drain extended transistors is a PMOS transistor that is drain-connected to said NMOS transistor, and wherein said drains of said drain extended transistors are connected to said output.

18. An output buffering method, comprising:

receiving input signaling having an input voltage swing between a reference voltage and an input voltage;

in response to said input signaling, providing output signaling having an output voltage swing between said reference voltage and an output voltage that is greater than said input voltage;

producing in response to said output voltage an intermediate voltage having a predetermined relationship relative to said output voltage, including automatically adjusting said intermediate voltage in response to a change in said output voltage to maintain said predetermined relationship of said intermediate voltage relative to said output voltage; and said providing step including translating said input signaling into intermediate signaling having an intermediate voltage swing between said intermediate voltage and said output voltage, and translating said intermediate signaling into said output signaling.

19. The method of claim 18, wherein said predetermined relationship is that said intermediate voltage is less than said output voltage by a predetermined amount.

20. The method of claim 18, wherein said output voltage is more than twice as large as said input voltage.

21. An analog controlled high-voltage interfaced bias circuit which comprises:

an operational amplifier having a reference input, a second input and an output; a power supply;

a first resistor coupled having a pair of opposing terminals, one of said opposing terminals coupled to a source of reference voltage;

a second resistor having a pair of opposing terminals, one of said opposing terminals coupled to said power supply;

a drain extended transistor having a gate coupled to said output of said operational amplifier, an extended drain coupled to the other of said opposing terminals of said second resistor and a source coupled to said second input and the other of said opposing terminals of said first resistor; and a capacitor coupled across said second resistor.

22. The circuit of claim 21 wherein the resistances of said first and second resistors have a predetermined ratio based upon the voltage at said reference input of said operational amplifier.

23. A controlled high-voltage interfaced bias circuit, which comprises:

a power supply;

a reference voltage source;

a plurality of cascaded MOS diodes, one end of said cascaded diodes coupled to said reference voltage source;

a capacitor coupled between said reference voltage source and the other end of said cascaded diodes; and a source follower coupled between said power supply and said other end of said cascaded diodes.

24. The circuit of claim 23 wherein said source follower comprises a resistor, one end of said resistor coupled to said power supply, a first drain extended MOS transistor with the extended drain coupled between said other end of said resistor and the other end of said cascaded diodes, the gate of said first drain extended MOS transistor coupled to said one end of said resistor, and a second drain extended MOS transistor having a gate coupled to said extended drain of said first drain extended MOS transistor, an extended drain coupled to said power supply and a source coupled to said other end of said cascaded MOS diodes.

25. The circuit of claim 24 wherein said cascaded diodes are NMOS transistors.

26. A controlled high-voltage interfaced bias circuit, which comprises:

a power supply;

a reference voltage source;

a plurality of cascaded MOS diodes, one end of said cascaded diodes coupled to said power supply;

a capacitor coupled between said power supply and the other end of said cascaded diodes; and a source follower coupled between said reference voltage source and said other end of said cascaded diodes.

27. The circuit of claim 26 wherein said source follower comprises a resistor, one end of said resistor coupled to said power supply, a first drain extended MOS transistor with the extended drain coupled between said other end of said resistor and the other end of said cascaded diodes, the gate of said first drain extended MOS transistor coupled to said one end of said resistor, and a second drain extended MOS transistor having a gate coupled to said extended drain of said first drain extended MOS transistor, an extended drain coupled to said power supply and a source coupled to said other end of said cascaded MOS diodes.

28. The circuit of claim 27 wherein said cascaded diodes are PMOS transistors.

\* \* \* \* \*